United States Patent [19]

Marotel

[11] Patent Number: 4,851,791
[45] Date of Patent: Jul. 25, 1989

[54] TEMPERATURE-COMPENSATED PIEZOELECTRIC OSCILLATOR

[75] Inventor: Gárard Marotel, Sartrouville, France

[73] Assignee: Compagnie d'Electronique et de Piezoelectricite - C.E.P.E., Argenteuil, France

[21] Appl. No.: 249,325

[22] Filed: Sep. 26, 1988

[30] Foreign Application Priority Data

Sep. 29, 1987 [FR] France ............................ 87 13454

[51] Int. Cl.$^4$ .................. H03B 5/32; H03L 1/00
[52] U.S. Cl. .................................... 331/158; 331/176; 331/177 V
[58] Field of Search ................. 331/36 C, 66, 116 R, 331/116 FE, 158, 176, 177 V

[56] References Cited

U.S. PATENT DOCUMENTS 4,028,638  6/1977  Towle .......................... 331/116 R X

FOREIGN PATENT DOCUMENTS 2284219  4/1976  France .
2038125  7/1980  United Kingdom .

Primary Examiner—David Mis
Attorney, Agent, or Firm—Oblon, Spivak, McClelland, Maier & Neustadt

[57] ABSTRACT

A temperature-compensated piezoelectric oscillator is disclosed. This oscillator comprises an oscillating circuit consisting of an amplifier, the output of which is looped back to the input through a piezoelectric resonator which is series mounted with a variable capacitance element, a circuit for the regulation of frequency according to temperature giving a compensation voltage and a circuit for frequency adjustment giving a variable in time resetting voltage, wherein the circuit for regulating the frequency according to temperature is connected to one of the terminals of the variable capacitance element through a means, the gain of which varies according to the resetting voltage delivered by the frequency adjusting circuit.

3 Claims, 4 Drawing Sheets

TEMPERATURE-COMPENSATED PIEZOELECTRIC OSCILLATOR

BACKGROUND OF THE INVENTION

1. Field of the Invention

The present invention concerns temperature-compensated piezoelectric oscillators, namely piezoelectric oscillators comprising a system for regulating frequency according to temperature.

2. Description of the Prior Art

Like standard piezoelectric oscillators, temperature-compensated oscillators consist of an amplifier which has its output connected to the input through a circuit comprising an oscillating piezoelectric resonator, the gain of the system being in a ratio of more than 1 in order to meet the conditions of self-oscillation. In this case, the frequency compensation is obtained by connecting, in series with the piezoelectric resonator, an element with a capacitance that is variable according to the voltage applied to its terminals, for example an element such as a variable capacitance diode, and by creating the voltage to be applied to the variable capacitance diode (or compensation voltage) in a compensation circuit including an element sensitive to temperature.

Temperature compensation systems make it possible to obtain a frequency that is practically stable whatever the temperature at the output of the oscillator. However, piezoelectric oscillators are subject to an ageing phenomenon, i.e. their oscillation frequency changes with time. It is therefore necessary to reset the oscillator as a function of time. This resetting consists in modifying the impedance in series with the piezoelectric resonator so as to obtain the nominal frequency of the oscillator. When variable capacitance diodes are used, the resetting operation consists in modifying the voltage at its terminals. Now, this resetting modifies the temperature compensation.

For, as shown schematically in FIG. 1, one embodiment of a resetting circuit used in a temperature-compensated piezoelectric oscillator is formed by a potentiometer Pe, mounted in series between the supply voltage $V_A$ and one terminal of a resistor R, the other terminals of which is grounded. The middle terminal of the potentiometer Pe is connected by means of a resistor R' to the cathode of the variable capacitance diode D. Furthermore, in the embodiment shown, the anode of the variable capacitance diode D is connected to the circuit CT for the regulation of frequency according to temperature. In a known way, the variable capacitance diode is mounted in series with the piezoelectric resonator P and the amplifier A, the output of which is looped to the anode of the variable capacitance diode D. Thus, when the potentiometer is made to vary in order to achieve the frequency resetting of the oscillator, the bias voltage of the variable capacitance diode is modified. Now, as shown in FIGS. 2A and 2B, the capacitance/voltage characteristic does not provide for obtaining a linear frequency variation as a function of its bias voltage. The result of this, therefore, is a modification of the slope P0 of the transfer function, which becomes the slope P1. This modification of the slope implies a rotation of the compensation curve as shown in FIG. 3 which concerns a frequency resetting of $\pm 5.10^{-6}$ in the rated frequency $F_O$. Furthermore, the coefficient of temperature of the variable capacitance diode varies according to the bias voltage (FIG. 2C), thus accentuating the rotation effect of the compensation curve.

In this FIG. 3, the straight line a at $F_O$ represents the ideal compensation at the time $T_O$, the curves b and b' represents the frequency coming from the oscillator after positive or negative resetting for a frequency drift of $\pm 5.10^{-6}$ FO. This distortion of the compensation curve have many drawbacks. In particular, the oscillator may be taken beyond the characteristics laid down by the specification.

SUMMARY OF INVENTION

An aim of the present invention, therefore, is to overcome these drawbacks, and an object of the present invention is a temperature-compensated piezoelectric oscillator comprising an oscillating circuit consisting of an amplifier, the output of which is looped back to the input through a piezoelectric resonator which is series mounted with a variable capacitance element, a circuit for the regulation of frequency according to temperature giving a compensation voltage and a circuit for frequency adjustment giving a variable in time resetting voltage, wherein the circuit for regulating the frequency according to temperature is connected to one of the terminals of the variable capacitance element through a means, the gain of which varies according to the resetting voltage delivered by the frequency adjusting circuit.

According to a preferred embodiment, the means wherein the gain varies according to the resetting voltage consists of an operational amplifier comprising a negative feedback resistor and receiving the resetting voltage at its inverting input and the compensation voltage at its non-inverting input.

BRIEF DESCRIPTION OF THE DRAWINGS

Other features and advantages of the present invention will appear from the following description of an embodiment, made with reference to the appended drawings, of which.

To simplify the description, the same references are repeated for the same elements in all the figures.

DESCRIPTION OF THE A PREFERRED EMBODIMENT

Figure 4:
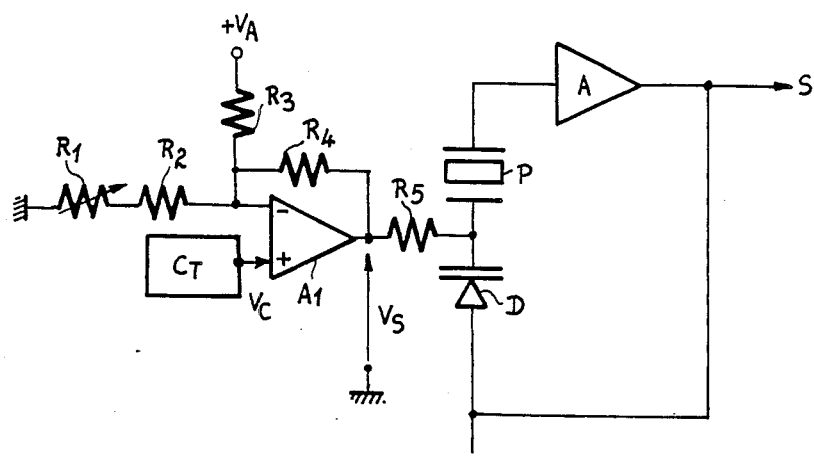
FIG. 4 gives a schematic view of a temperature-compensated oscillator according to the present invention.

FIG. 4 shows a temperature-compensated oscillator according to the present invention. This oscillator includes, in a known way, an amplifier 1, the output S of which is looped back to the input by means of a piezoelectric resonator P mounted in series with a variable capacitance diode D. In accordance with the present invention, a temperature compensation voltage Vc is applied to the cathode of the variable capacitance diode through a means, the gain of which varies according to the resetting voltage. The resetting voltage is variable in course of time. More specifically, this means comprises an operational amplifier $A_1$, the non-inverting input of which receives the compensation voltage $V_C$ coming from the circuit CT for the regulation of frequency according to temperature. Furthermore, its inverting input receives a voltage depending on the given resetting. This voltage is given by a divider bridge. Thus, the inverting input is connected through the resistor $R_3$ to the supply voltage $V_A$. This inverting input is also connected to the ground through the resistor $R_2$ and a variable resistor $R_1$. The operational amplifier $A_1$ further has a negative feedback resistor $R_4$ mounted between its output and its inverting input. Furthermore, the operational amplifier $A_1$ is connected to the cathode of the variable capacitance diode D through a resistor $R_5$. With the above circuit, the output voltage $V_S$ of the operational amplifier $A_1$ is given by the following equation.

$$V_S = V_C \left(1 + \frac{R_4}{R_2 + R_1} + \frac{R_4}{R_3}\right) - V_A \frac{R_4}{R_3}$$

Furthermore, the resetting voltage is generally got by causing variation in the resistance of the resistor $R_1$: this resistance is external to the system and its variation is fixed for a given system.

With the above circuit, the resistance values will be calculated by iteration so as to adjust the gain according to the correction that it is desired to apply. For, in temperature-compensated oscillators, a frequency shift is imposed making it possible to reset the product for many years. Thus, the resistance values of the resistors, $R_2$, $R_3$, $R_4$, will be computed from the following equations:

at 25° C. and at the rated frequency $F_O$, we have:

$$V_{S1} = V_{C1} \left(1 + \frac{R_4}{R_2 + R_1} + \frac{R_4}{R_3}\right) - V_A \frac{R_4}{R_3}$$

After resetting $V_{S1} \rightarrow V_{S2}$ with the following equation:

$$V_{S2} = V_{C1} \left(1 + \frac{R_4}{R_2 + R'_1} + \frac{R_4}{R_3}\right) - V_A \frac{R_4}{R_3}$$

where $R'_1$ is the resistance value of the resistor $R_1$ after resetting.

Figure 1:
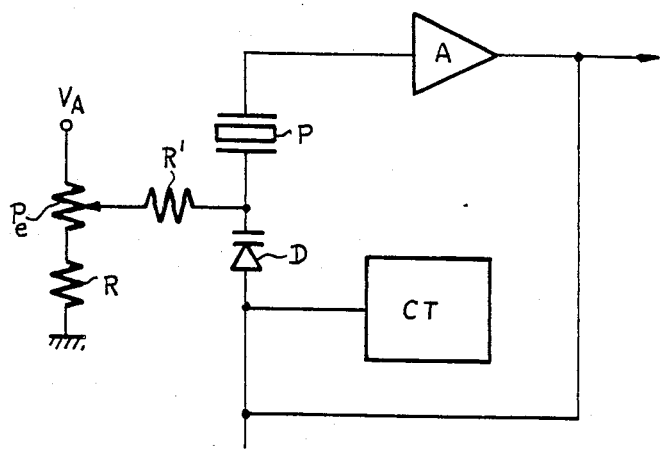
FIG. 1, already described, is a schematic view of a temperature-compensated oscillator according to the prior art.
Figure 2:
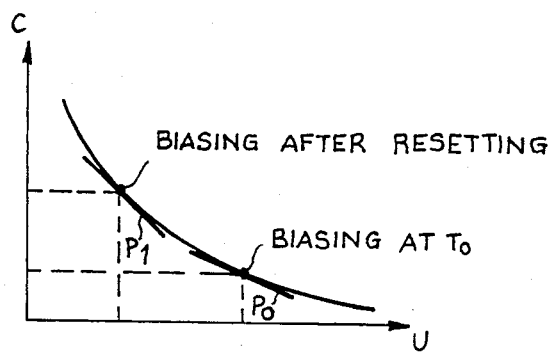
FIG. 2A, already described, shows the capacitance/voltage characteristic curve of a variable capacitance diode.
FIG. 2B, already described, shows the frequency/voltage characteristic curve of the oscillator.
FIG. 2C, already described, shows the variation of the temperature coefficient of a variable capacitance diode as a function of its bias voltage.
Figure 2B:
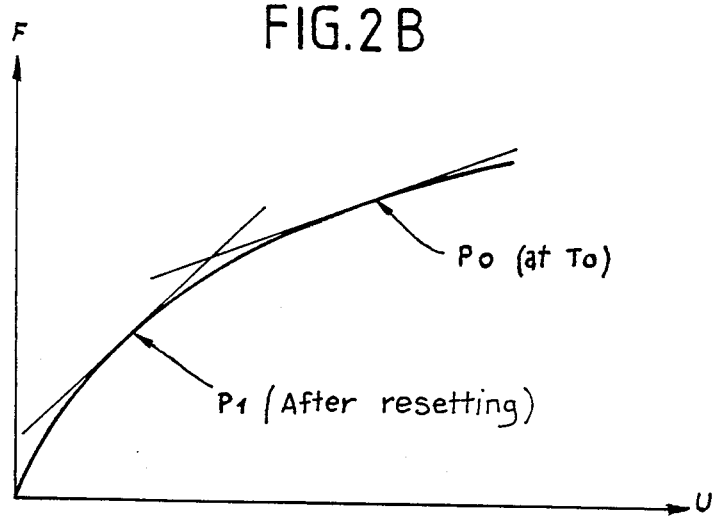
Figure 2C:
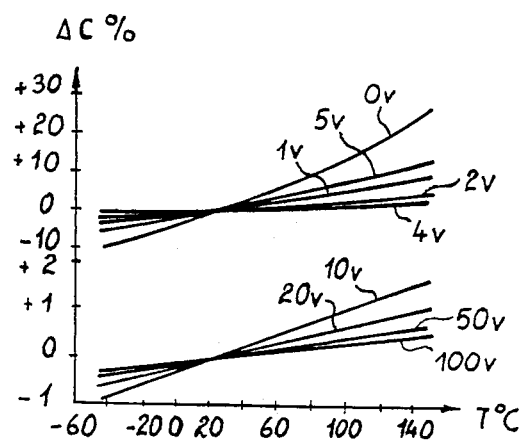
Figure 3:
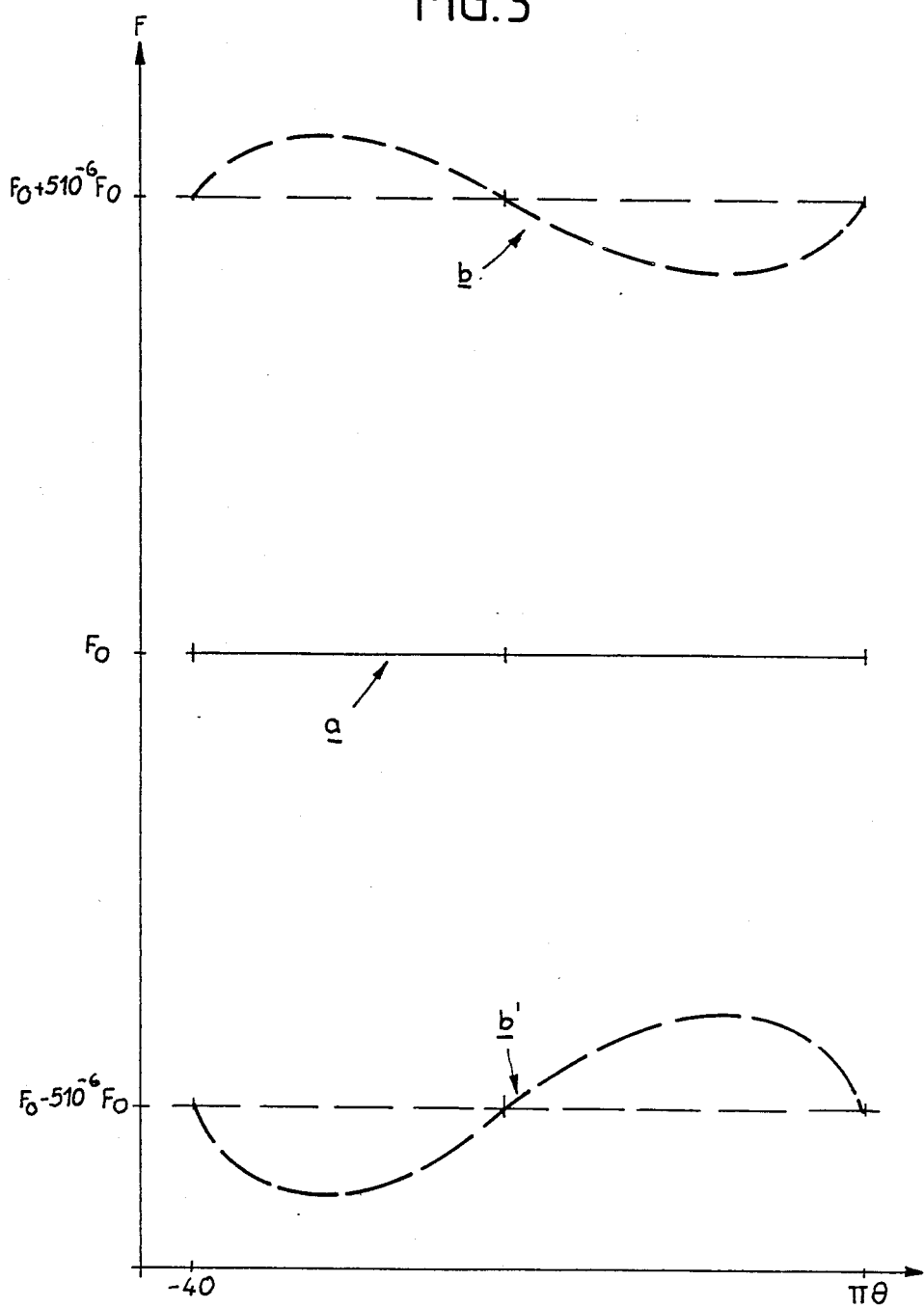
FIG. 3, already described, shows the frequency compensation curve as a function of the time TO and after long-term ageing, obtained with the oscillator of FIG. 1.

Furthermore, a simple observation of the curve representing the drift of the piezoelectric resonator as a function of temperature and the curve showing the rotation of compensation with resetting (see FIG. 3) shows that the maximum levels correspond to the points of inversion of the piezoelectric resonator. Hence, the points of inversion of the piezoelectric resonator can be used as calibration points. This gives another pair of equations representing the voltage necessary at the temperature considered.

at the point of inversion and at the rated frequency $F_O$, we have the following equation:

$$V_{S3} = V_{C2} \left(1 + \frac{R_4}{R_2 + R_1} + \frac{R_4}{R_3}\right) - V_A \frac{R_4}{R_3}$$

and at the point of inversion and after resetting $(V_{S3} \rightarrow V_{S4})$, we have the following equation:

$$V_{S4} = V_{C2} \left(1 + \frac{R_4}{R_2 + R'_1} + \frac{R_4}{R_3}\right) - V_A \frac{R_4}{R_3}$$

Since the value of $R_1$ and its variation $R'_1$ are imposed, it suffices to resolve this system of four equations giving the output voltages $V_{S1}$, $V_{S2}$, $V_{S3}$, $V_{S4}$ in the given configurations to obtain the values $R_2$, $R_3$ and $R_4$. The voltages $V_{S1}$ and $V_{S3}$ are the voltages needed to obtain the rated frequency $F_0$ while the voltages $V_{S2}$ and $V_{S4}$ are the voltages giving the same frequency shift.

Figure 5:
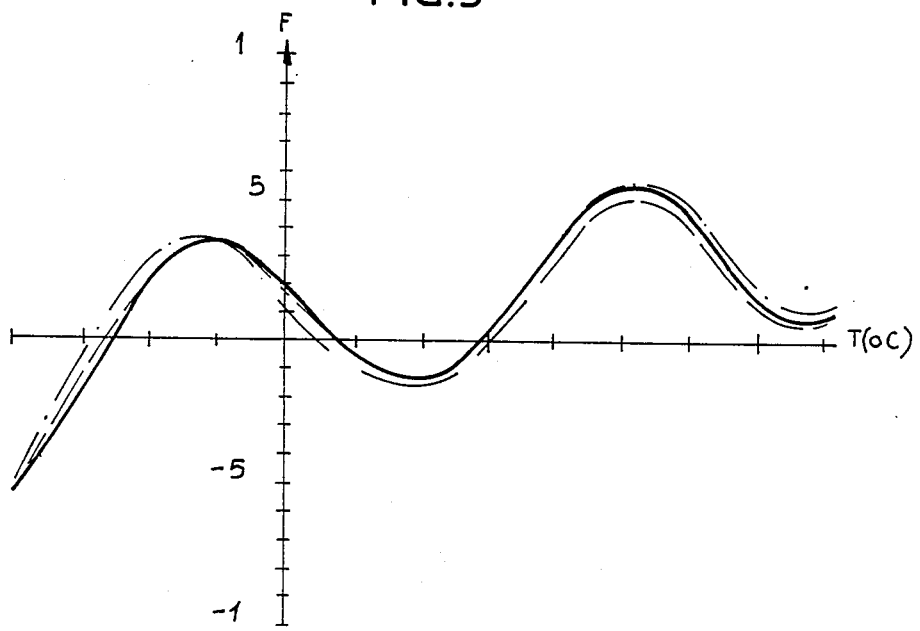
FIG. 5 shows the frequency compensation curve as a function of the temperature obtained with the oscillator of the present invention.

With the above-described circuit, we get the curve of frequency variation as a function of temperature, shown in FIG. 5. It is seen, in this curve, that the frequency $F_O$ develops in a substantially identical way even after resetting.

What is claimed is:

1. A temperature-compensated piezoelectric oscillator comprising an oscillating circuit consisting of an amplifier, the output of which is looped back to the input through a piezoelectric resonator which is series mounted with a variable capacitance element, a circuit for the regulation of frequency according to temperature giving a compensation voltage and a circuit for frequency adjustment giving a variable in time resetting voltage, wherein the circuit for regulating the frequency according to temperature is connected to one of the terminals of the variable capacitance element through a means, the gain of which varies according to the resetting voltage delivered by the frequency adjusting circuit.

2. An oscillator according to claim 1 wherein the means, the gain of which varies according to the resetting voltage, is formed by an operational amplifier comprising a negative feedback resistor and receiving the resetting voltage at its inverting input and the compensation voltage at its non-inverting input.

3. An oscillator according to claim 2 wherein the resetting voltage is delivered by a bridge of resistors mounted as a divider and comprising a variable resistor.

* * * * *